United States Patent
Iwase et al.

(10) Patent No.: US 7,632,358 B2
(45) Date of Patent: Dec. 15, 2009

(54) CLEANING METHOD AND A CLEANING DEVICE FOR CLEANING AN EDGE PORTION AND BACK FACE OF A WAFER

(75) Inventors: Masao Iwase, Yokohama (JP);
Kazuhiko Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 631 days.

(21) Appl. No.: 11/442,974

(22) Filed: May 31, 2006

(65) Prior Publication Data
US 2006/0272676 A1  Dec. 7, 2006

(30) Foreign Application Priority Data
Jun. 1, 2005  (JP) ............................ P2005-161589

(51) Int. Cl.
*B08B 7/04* (2006.01)
*B05D 3/12* (2006.01)

(52) U.S. Cl. ........................... 134/18; 134/33; 134/902; 427/8; 427/240

(58) Field of Classification Search ........................ None
See application file for complete search history.

(56) References Cited

U.S. PATENT DOCUMENTS

2003/0106642 A1* 6/2003 Fairbairn et al. ....... 156/345.24

FOREIGN PATENT DOCUMENTS

JP  02-198131  8/1990

* cited by examiner

*Primary Examiner*—Alexander Markoff
*Assistant Examiner*—Nicole Blan
(74) *Attorney, Agent, or Firm*—Finnegan, Henderson, Farabow, Garrett & Dunner, L.L.P.

(57) ABSTRACT

A method for cleaning a wafer includes measuring a cross-sectional shape of an edge portion of wafer cut along a radial direction, assigning the measured shape to one of a plurality of groups classified by the shapes, determining an amount of cleaning liquid to be supplied and rotational speed at which the wafer is rotated depending a determination criterion, rotating the wafer and spraying the cleaning liquid toward a back face of the rotating wafer, and cleaning the edge portion and the back face of the wafer by spreading the cleaning liquid to the edge portion of the wafer.

10 Claims, 7 Drawing Sheets

HEIGHT OF A BEAD

| GROUP A | GROUP B | GROUP C |
|---|---|---|
| $100\mu m \leq L \leq 170\mu m$ | $170\mu m < L < 250\mu m$ | $250\mu m \leq L \leq 300\mu m$ |

CLEANING METHOD AND A CLEANING DEVICE FOR CLEANING AN EDGE PORTION AND BACK FACE OF A WAFER

CROSS REFERENCE TO RELATED APPLICATIONS AND INCORPORATION BY REFERENCE

This application is based upon and claims the benefit of priority from the prior Japanese Patent Applications No. P2005-161589, filed on Jun. 1, 2005; the entire contents of which are incorporated herein by reference.

BACKGROUND OF THE INVENTION

1. Field of the Invention

The present invention relates to a cleaning device used in manufacturing processes for various electronic devices manufactured on a disk-shaped wafer, such as semiconductor devices. More particularly, the present invention relates to a method and device for cleaning the edge portion and back face of a wafer while rotating the wafer.

2. Description of the Related Art

In the photolithography process of the semiconductor device fabrication processes, a resist coating process for coating a semiconductor wafer with a resist film is performed.

In general, the resist coating process is performed by using a spin-coating method. In the procedure of the spin-coating method, resist solution is dispensed to the center of a spinning wafer and spread across the surface of the wafer by centrifugal force. The spin speed of the semiconductor wafer is controlled, whereby the thickness of a layer of resist solution on the semiconductor wafer is controlled. In this process, the resist solution sometimes overflows the target bounds within which a resist film is to be formed, and adheres to the edge portion and even to the back face of the semiconductor wafer. Japanese Patent Application Unexamined Publication No. H02-198131 describes a cleaning process in which, to remove resist solution adhering to the edge portion and back face of a semiconductor wafer, for example, cleaning liquid is supplied to the back face of the semiconductor wafer while rotating the semiconductor wafer, thus cleaning the edge portion and back face of the semiconductor wafer. After the cleaning process is complete, a process for drying the semiconductor wafer is performed in which the semiconductor wafer is further continuously rotated, thereby spinning off the cleaning liquid adhering to the back face of the semiconductor wafer. In this manner, the resist coating process is complete, and a resist film with a predetermined thickness is formed on the semiconductor wafer.

Moreover, during a lot process in the semiconductor fabrication processes, there are some cases where dust generated from semiconductor wafers or from processing equipment adheres to a semiconductor wafer. Of the generated dust particulates, those adhering to the edge portion and back face of the semiconductor wafer are removed, similarly to the removal of resist, by supplying cleaning liquid from the back side of the semiconductor wafer while rotating the semiconductor wafer.

However, different semiconductor wafers have different edge shapes, which also vary with the manufacture. Accordingly, there are some cases where dust or resist adhering to the edge portion of a semiconductor wafer cannot be perfectly removed and consequently remains. If resist remains on the edge portion of a semiconductor wafer, a problem arises that resist particles may be generated due to contact with a robot arm and the like when the semiconductor wafer is being transported. If dust remains on the edge portion of a semiconductor wafer, a problem arises that the dust may migrate to a device region on the front face of the semiconductor wafer, resulting in a fatal defect, leading to a decrease in yield. On the other hand, if a large quantity of cleaning liquid is supplied to remove resist and dust remaining on the edge portion, a problem also arises that the cleaning liquid may migrate to the front side and enter a device region on the front face of the semiconductor wafer to reduce the resist-coated region formed in the device region, resulting in a smaller device region.

These problems are not peculiar to the semiconductor device fabrication, and similar problems also exist in the manufacturing of various electronic devices such as crystal liquid displays, magnetic storage media, and superconducting devices.

SUMMARY OF THE INVENTION

An aspect of the present invention inheres in a method for cleaning a wafer including measuring a cross-sectional shape of an edge portion of a disk-shaped wafer cut along a radial direction, assigning the measured shape to one of a plurality of groups classified by the shapes, determining an amount of cleaning liquid to be supplied and rotational speed at which the wafer is rotated depending a determination criterion which the classification by the shapes, rotating the wafer at the rotational speed determined by a controller and spraying the cleaning liquid toward a back face of the rotating wafer, and cleaning the edge portion and the back face of the wafer by spreading the cleaning liquid to the edge portion of the wafer by centrifugal force.

Another aspect of the present invention inheres in a cleaning device including a stage provided to rotate a disk-shaped wafer, a measurement unit to measure at least one of a cross-sectional shape of an edge portion of the wafer and a wettability of the edge portion of the wafer, a determination unit, by assigning at least one of the measured shape and the wettability to one of the corresponding groups classified by the shape or the wettability, to determine an amount of cleaning liquid to be supplied and a rotational speed at which the wafer is rotated, based on determination criteria including the classifications by the shape and the wettability, and a cleaning liquid supply unit to supply on amount of cleaning liquid to a back face of the wafer.

DETAILED DESCRIPTION OF THE INVENTION

Figure 1:
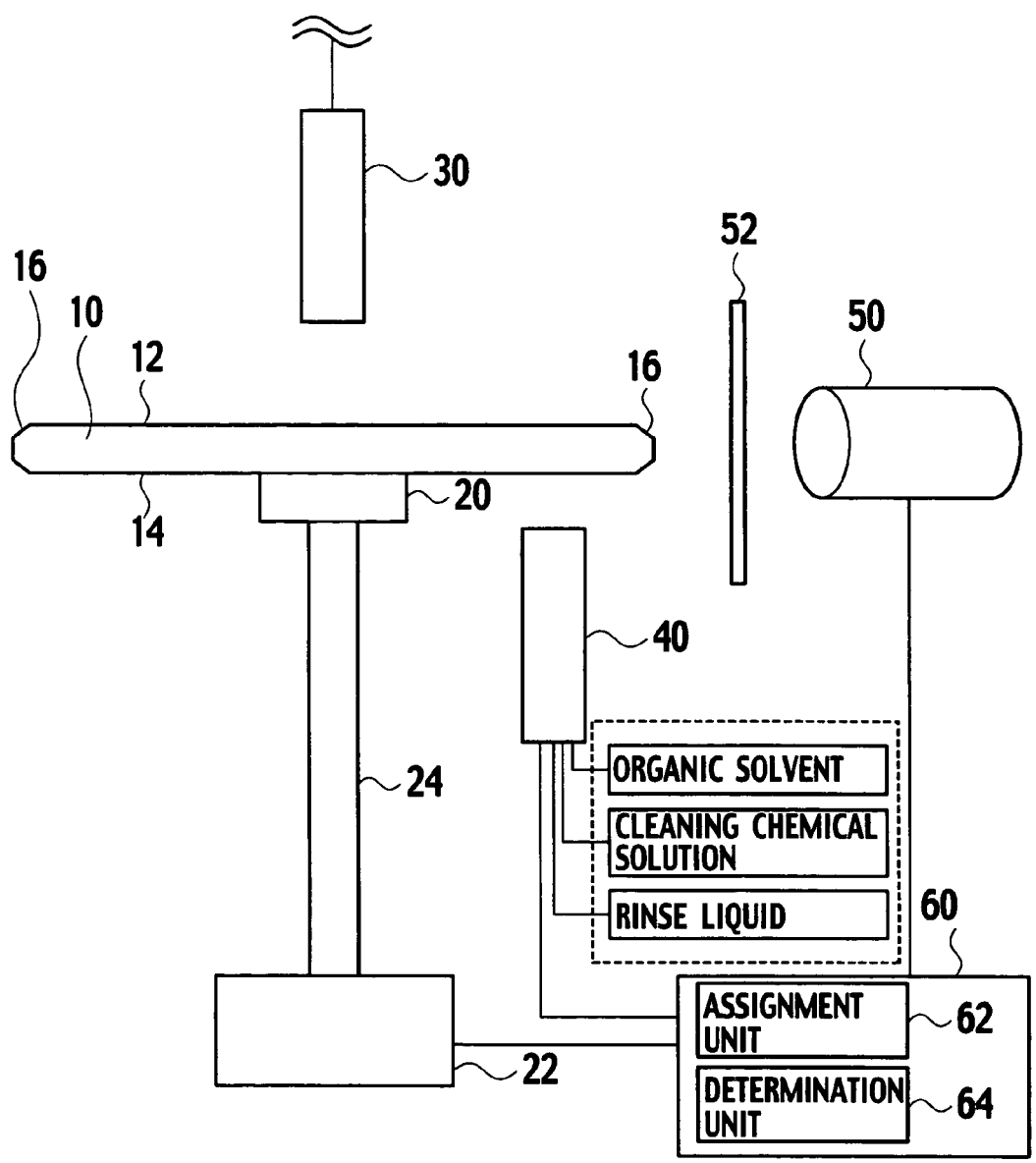
FIG. 1 is a view showing a frame format of a cleaning device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details.

Hereinafter, a cleaning device will be described for use in semiconductor device fabrication. However, the use of the cleaning device in semiconductor device fabrication is shown for illustrative purposes, and, as a matter of course, the cleaning device is applicable to a cleaning process in the manufacturing of various electronic devices other than semiconductor devices, such as liquid crystal displays, heads for magnetic storage media, and superconducting devices, as long as the electronic device uses a disk-shaped wafer having a bevel in the edge portion. Here, it is needles to say that disk-shaped wafers may include those having a cut-away portion in the circumference, such as a flat portion called an orientation flat (OF), which is well known in semiconductor wafers.

(Cleaning Device)

Referring to FIG. 1, a cleaning device according to an embodiment of the present invention includes a stage 20, a measurement unit 50, a determination unit 60, and a cleaning liquid supply unit 40. The stage 20 allows a disk-shaped wafer 10 to be rotated in the circumferential direction. The measurement unit 50 measures at least one of the shape and wettability of an edge portion 16 of the wafer 10. The determination unit 60 determines, by assigning at least one of the measured shape and wettability, based on determination criteria, the amount of cleaning liquid to be supplied and the rotational speed at which the wafer 10 is rotated, the determine criteria include the classifications by the shape and the wettability. The cleaning liquid supply unit 40 supplies cleaning liquid equal to the determined amount to a back face 14 of the wafer 10. Here, in the case of a semiconductor device, the "wafer 10" is a semiconductor wafer such as a silicon (Si) wafer or gallium arsenide (GaAs) wafer. However, a wafer of superconducting material is equivalent to the "wafer 10" in the case of a superconducting device such as a Josephson device, and the wafer 10 can refer to disks of other various materials, including a ceramic substrate and the like. Moreover, the wafer 10 is a raw material wafer supplied from a wafer maker in the first place and is changed into a "new wafer" as it undergoes the fabrication processes, with a new coating or the like being formed on the surface in each process. Therefore, the wafer 10 is defined as a wafer which undergoes a process step to be currently performed. The cleaning device according to this embodiment further includes a front-side supply unit 30 provided in the vertical direction of a rotation axis 24, that is, above the center of the wafer 10. The front-side supply unit 30 dispenses, for example, a resist solution primarily containing a novolac-type photosensitive agent to a central portion of a front face 12 of the wafer 10. Moreover, the front-side supply unit 30 blows gas to the front face 12 of the wafer 10.

The rotational driving force of a driving motor 22 is transmitted to the stage 20 along the rotation axis 24, and therefore the stage 20 can be driven to rotate about the rotation axis 24. Moreover, the stage 20 is provided with a vacuum chuck or the like to hold the wafer 10. The stage 20 holds the wafer 10, with the center of the wafer 10 aligned with the center of rotation of the stage 20. The stage 20 is formed so that its diameter is smaller than the diameter of the wafer 10, in general, and that only a central portion of the back face 14 of the wafer 10 is placed on the stage 20.

The cleaning liquid supply unit 40, arranged under the wafer 10, ejects or sprays cleaning liquid toward the back face 14 of the wafer 10. As the cleaning liquid supplied from the cleaning liquid supply unit 40, an organic solvent for dissolving the resist, such as thinner, cyclohexanone or γ-butyl lactone, and a rinse liquid for rinsing off the cleaning solvent adhering to the wafer 10, such as ultrapure water, can be used. Further, as other cleaning liquids, a cleaning chemical solution for washing off dust adhering to the wafer 10, such as aqueous ammonia solution ($NH_4OH$), hydrochloric acid (HCl), hydrogen fluoride (HF), choline, tetramethylammonium hydroxide (TMAH), ozone ($O_3$) water, or a combination (mixed solution) of any of these cleaning chemical solutions, can be used.

Figure 2:
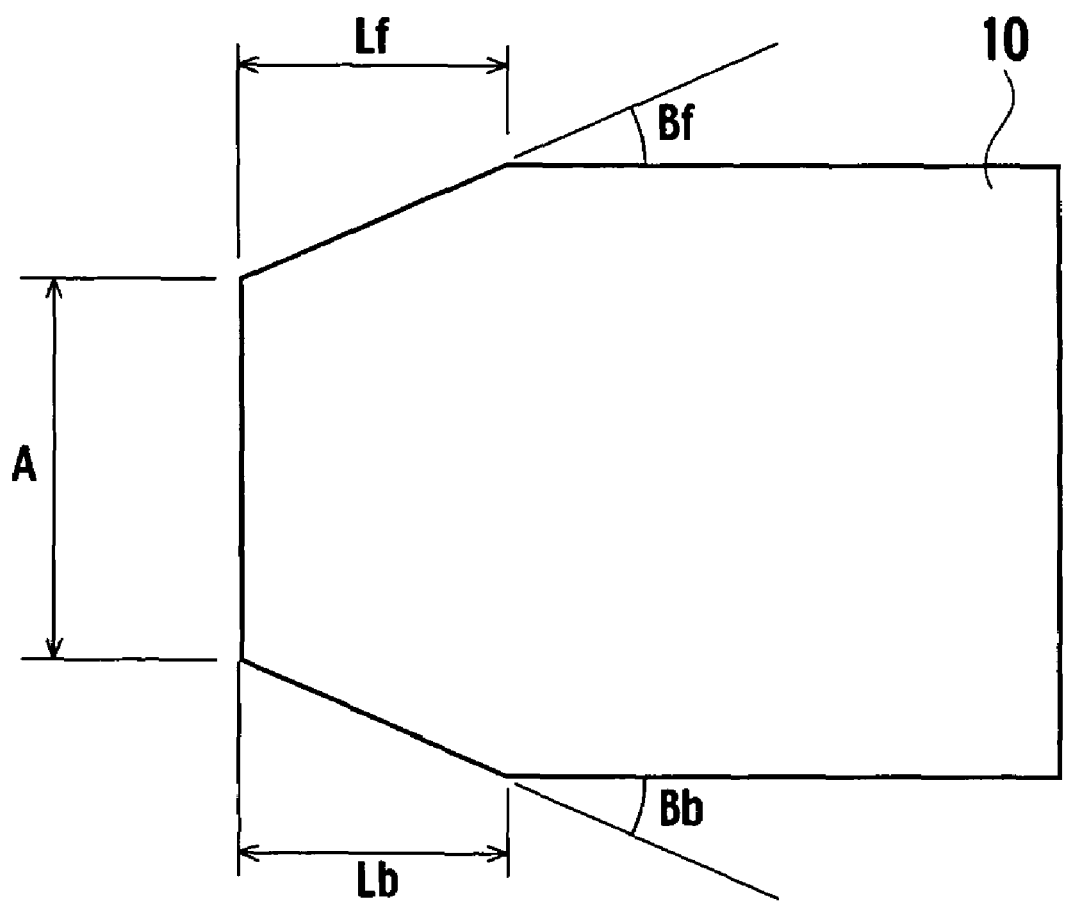
FIG. 2 is a cross-sectional view of an edge portion of the disk-shaped wafer according to the embodiment of the present invention.
Figures 3, 4:
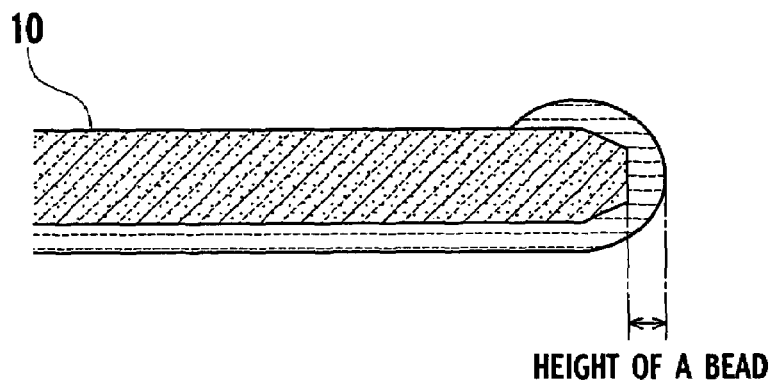
FIG. 3 is a cross-sectional view of a height of a bead of liquid adhering to the edge portion of the wafer according to the embodiment of the present invention.
FIG. 4 shows an example of a group classified on the basis of length of the edge portion of the wafer according to the embodiment of the present invention.

The measurement unit 50 is an acoustic array sensor, image sensor such as a CCD camera, or the like and is capable of measuring the shape of the edge portion 16 of the wafer 10 as shown in FIG. 2. The measurement unit 50 measures at least one of the following parts of the edge portion 16: as shown in FIG. 2, a front-side length Lf and a back-side length Lb in the radial direction in the cross-sectional shape of the bevels of the edge portion 16, a length A of a flat region of the edge portion 16, an angle Bf between the front face 12 and the front bevel in the cross-sectional shape, an angle Bb between the back face 14 and the back bevel in the cross-sectional shape, and the like. In addition, the measurement unit 50 can measure the height of a bead of liquid, such as pure water, adhering to the edge portion 16 of the wafer 10, as shown in FIG. 3. The measurement unit 50 may be composed of a single sensor capable of measuring both the front-side length Lf of the edge portion 16 in the radial direction and the height of a bead of liquid adhering to the edge portion 16 as shown in FIG. 1, or may be composed of separate sensors performing respective measurements. The measurement results of the front-side length Lf of the edge portion 16 and the height of a bead of liquid adhering to the edge portion 16, measured by the measurement unit 50, are sent to the determination unit 60 as a signal. Preferably, a shutter 52 is provided between the measurement unit 50 and the wafer 10 to prevent a scattering of resist, cleaning liquid or the like from adhering to the measurement unit 50. The shutter 52 may have any structure, provided it is not obstructive to the measurement: for example, the shutter 52 may be openable only when the measurement unit 50 performs measurement, or the shutter 52 may be formed of translucent material or the like.

The determination unit 60 includes a assignment unit 62 and a determination unit 64. The measurement result of the shape of the edge portion 16, which is obtained from the signal sent from the measurement unit 50, is used as determination criteria. The assignment unit 62 assigns, from the determination criteria, the measured shape to one of a plurality of groups classified by the shapes. For each group, information is previously stored as to an optimum amount of cleaning liquid to be supplied and an optimum rotational speed at which the wafer 10 is to be rotated in the circumferential direction, with depending an determination criterion which the classification by the shapes respect to the shape of the edge portion 16. The determination unit 64 determines the amount of cleaning liquid to be supplied and the rotational speed at which the wafer 10 is to be rotated, depending an determination criterion which the classification by the shapes of the wafer 10.

Figure 5:
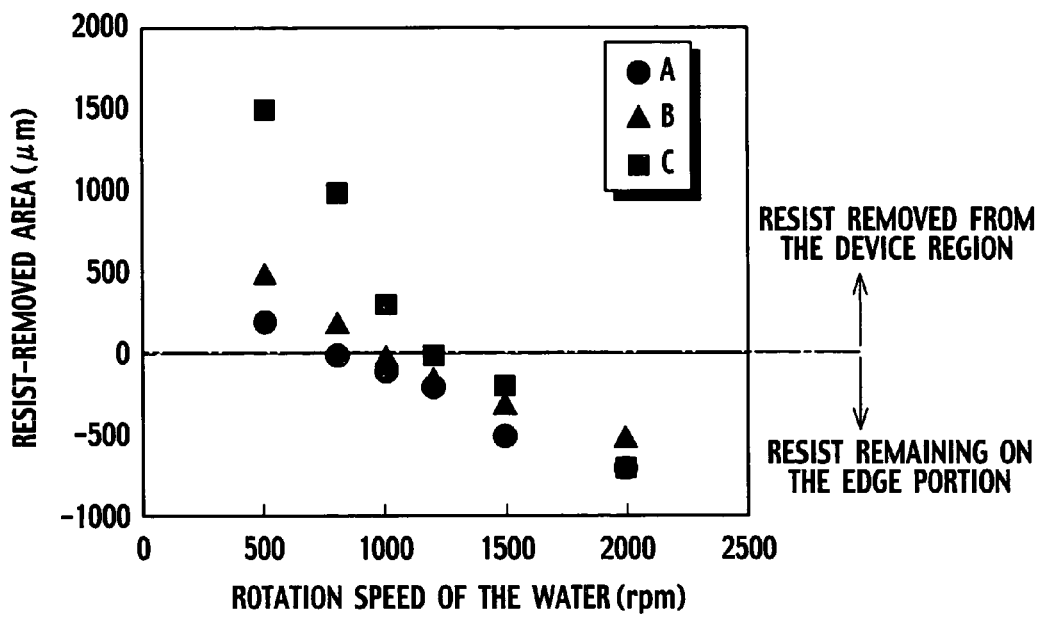
FIG. 5 is a graph to show a relation between a rotational speed of the wafer and a resist-removed area according to the embodiment of the present invention.

For example, in the case of classifying the wafer 10 into one of the groups in a first class, using the front-side length Lf as a determination criterion, the wafer 10 is classified into one of three groups as shown in FIG. 4: Group A (100 µm≦Lf≦170 µm), Group B (170 µm<Lf<250 µm), and Group C (250 µm≦Lf≦300 µm). The graph of FIG. 5 shows the relationship between the rotational speed of the wafer and the resist-removed area, for each of the groups with respect to the front-side length Lf of the edge portion 16, when the amount of sprayed cleaning liquid for removing a resist film is constant. Based on FIG. 5, the optimum rotational speed of the wafer is determined for each group of wafers with respect to the front-side length Lf of the edge portion 16. As shown in FIG. 5, at 1200 rpm, the wafer 10 classified in Group C has no resist remaining on the edge portion and has no resist removed from the device region. However, at 1500 rpm or higher, the resist remains on the edge portion, and at 1000 rpm or lower, the resist is removed from the device region. Therefore, based on the graph of FIG. 5, the optimum rotational speed of the wafer is determined as 700 rpm, 1000 rpm and 1200 rpm for Group A, Group B and Group C, respectively. As for the amount of sprayed cleaning liquid for removing a resist film, the optimum condition also varies among the groups of wafers with respect to the edge portion 16, as in the determination of the rotational speed of the wafer.

Figure 6:
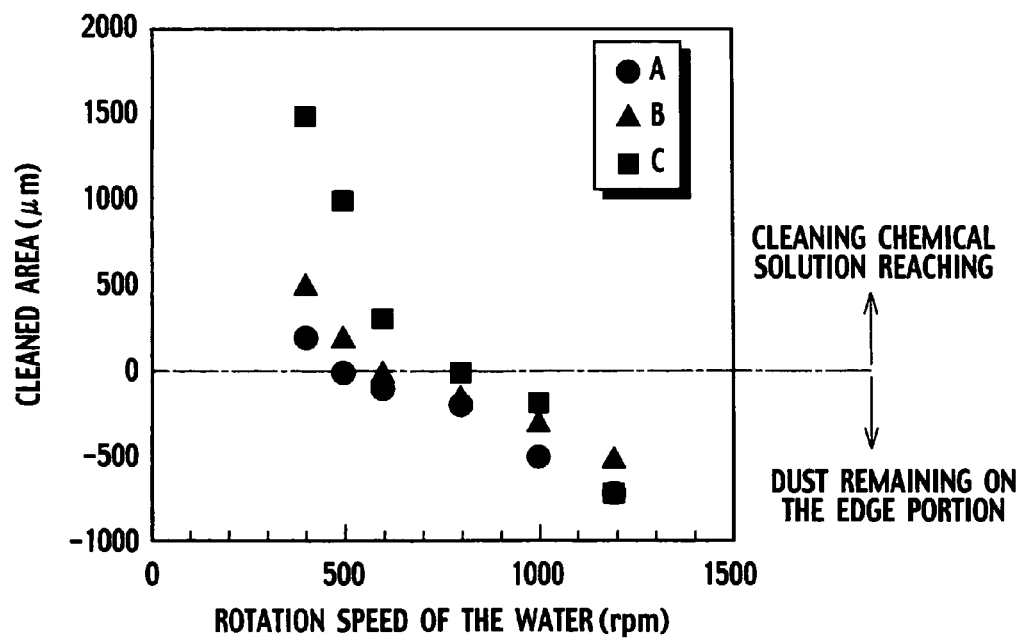
FIG. 6 is a graph to show a relation between the rotational speed of the wafer and a cleaned area according to the embodiment of the present invention.

Moreover, the graph of FIG. 6 shows the relationship between the rotational speed of the wafer and the cleaned area, for each of the groups with respect to the front-side length Lf of the edge portion 16, when the amount of sprayed cleaning liquid is constant. Based on FIG. 6, the optimum rotational speed of the wafer is determined for each group with respect to the front-side length Lf of the front bevel of the edge portion 16. As shown in FIG. 6, at 800 rpm, the wafer 10, classified in Group C, has no dust remaining on the edge portion and no cleaning chemical solution comes into contact with the device region. However, at 1000 rpm or higher, dust remains on the edge portion, and at 600 rpm or lower, the cleaning chemical solution contacts the device region. Therefore, based on the graph of FIG. 6, the optimum rotational speed of the wafer is determined as 500 rpm, 600 rpm and 800 rpm for Group A, Group B and Group C, respectively. As for the amount of the cleaning liquid sprayed on the wafer, the optimum condition also varies among the groups with respect to the edge portion 16, as in determination of the rotational speed of the wafer. Accordingly, by controlling the rotational speed of the wafer and the amount of cleaning liquid depending on the shape of the edge portion 16, it is possible to stably maintain the positional precision of the cleaned area in the edge portion 16.

Furthermore, the assignment unit 62 determines the wettability H of the edge portion 16. The height of the liquid bead is based on the height of a bead of liquid adhering to the edge portion 16, obtained from the signal sent from the measurement unit 50. Using the wettability H as a determination criterion, the assignment unit 62 determines which one of the groups in a second class the wafer 10 belongs. As examples of the groups in the second class, the wafer 10 is classified into a hydrophobic group when the determined value of wettability H≧500 µm, and is classified into a hydrophilic group when H<500 µm. For each group in the second class, information is previously set relating to an optimum amount of cleaning liquid to be supplied and an optimum rotational speed at which the wafer 10 is rotated, with respect to the wettability H of the edge portion 16. The determination unit 64 determines the amount of cleaning liquid to be supplied and the rotational speed at which the wafer 10 is rotated, depending on which group in the second class the wafer 10 is classified.

(Cleaning Method)

Figure 7:
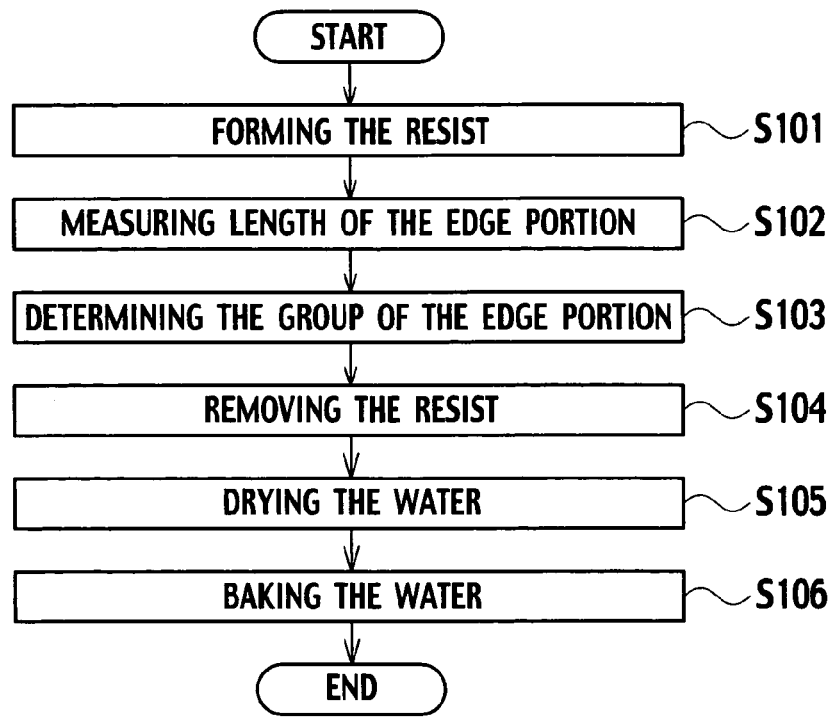
FIG. 7 is a flow chart showing a method for cleaning a wafer according to the embodiment of the present invention.

A wafer cleaning method for removing resist by using the cleaning device according to this embodiment of the present invention will be described with reference to the flowchart of FIG. 7.

(A) In Step S101, the wafer 10 in FIG. 1 is transported onto the stage 20 by a wafer transportation robot (not shown). The wafer 10 is fixed to the stage 20 with a vacuum chuck or the like. Then, resist solution is dispensed onto the front face 12 of the wafer 10 from the front-side supply unit 30, and a resist film is formed across the wafer 10 by rotating the stage 20.

(B) In Step S102, the front-side length Lf of the edge portion 16 in the front face 12 of the wafer 10 is measured by using the measurement unit 50. Preferably, the average measured value is taken as the front-side length Lf by, for example, performing measurement of the front-side length Lf of the edge portion 16 at the plurality of points. The measurement result is sent to the determination unit 60 as a signal.

(C) In Step S103, using the front-side length Lf of the edge portion 16 as a determination criterion, the determination unit 60 determines which one of the groups in the first class the wafer 10 belongs. Information about an optimum amount of cleaning liquid to be supplied and an optimum rotational speed at which the wafer 10 is rotated with respect to the front-side length Lf of the edge portion 16 is previously set for each group in the first class. Therefore, the amount of cleaning liquid to be supplied and the rotational speed at which the wafer 10 is rotated are determined depending a determination criterion which the classification by the shapes of the edge portion 16.

(D) In Step S104, the wafer 10 is rotated at the rotational speed determined by the determination unit 60. Then, thinner, the cleaning liquid for removing the resist, is sprayed toward the back face 14 of the spinning wafer 10. As to the amount of liquid to be supplied, the amount determined by the determination unit 60 is supplied to the back face 14. The cleaning liquid sprayed onto the back face 14 is spread to the edge portion 16 of the wafer 10 by centrifugal force. Because the cleaning liquid is spread to the edge portion 16, the resist adhering to the edge portion 16 and back face 14 of the wafer 10 is removed.

(E) In Step S105, after the process of cleaning the edge portion 16 and back face 14 of the wafer 10 is complete, a process of drying the wafer 10 is performed to spin off the cleaning liquid adhering to the edge portion 16 and back face 14.

(F) In Step S106, the wafer 10 is transported by a wafer transportation robot (not shown) to a baking mechanism (not shown), where the wafer 10 is subjected to heat treatment.

Thus, the resist removal in the resist coating process step is complete, and a resist film with a predetermined thickness is formed only in the device region on the wafer 10.

In the cleaning method for removing resist using the cleaning device according to this embodiment, the front-side length Lf of the edge portion 16 is used as a determination criterion. However, as a matter of course, the determination criterion is not limited to the front-side length Lf. The back-side length Lb may be measured and used as a determination criterion, or the front-side length Lf and back-side length Lb are both measured and a combination of these may be used as a determination criterion. Alternatively, the length A of the flat region and the angles Bf and Bb are measured, and a combination of these may be used as a determination criterion. Further, the length A of the flat region, front-side length Lf, back-side length Lb, angle Bf, and angle Bb are measured, and a combination of these may be used as a determination criterion. In other words, classification can be performed with higher precision by increasing the measurement points and using an appropriate combination of the measurement results as a determination criterion.

According to the cleaning method for removing resist using the cleaning device of this embodiment of the present invention, substantially resist remains on the edge portion 16 because it is possible to control the optimum rotational speed and the optimum amount of cleaning liquid to be supplied for removing a resist film, depending on the shape of the edge portion 16. Moreover, it is possible to perform wafer cleaning without too much cleaning liquid being supplied so as to prevent the excess from contacting the device region on the front face of the wafer, so that none of a device, resist film and the like formed in the device region are removed. Accordingly there is no reduction of the device region.

(First Modification)

A different point for a cleaning method for removing resist according to a first modification of the embodiment of the present invention is that the wafer is monitored by using the measurement unit 50 to determine whether the resist remains on the edge portion 16 of the wafer 10. Other parts are substantially the same as the cleaning device shown in FIG. 1, and therefore overlapping description will be omitted.

Figure 8:
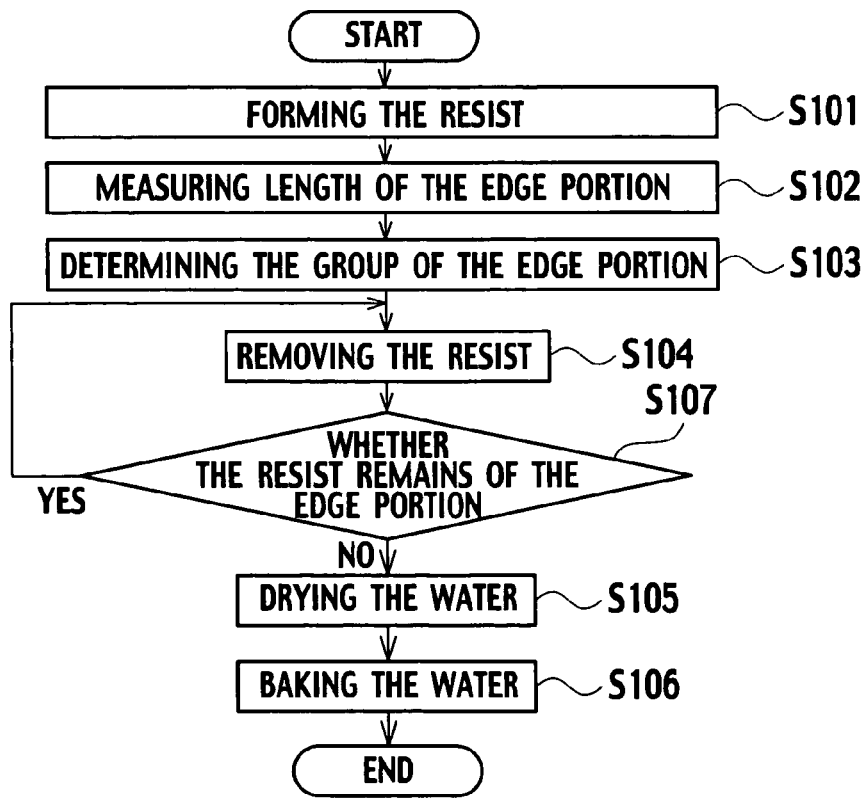
FIG. 8 is a flow chart showing a method for cleaning the wafer according to a first modification of the embodiment of the present invention.

Referring to the flowchart of FIG. 8, the cleaning method of the first modification further includes Step S107 after the resist removal process at Step S104. In Step S107, a measurement unit 50 such as a CCD camera monitors whether a resist film remains on the edge portion 16 of the wafer 10. The monitoring result is sent to the determination unit 60 as a signal. The determination unit 60 determines, from the transmitted signal, whether or not resist remains on the edge portion 16. When no resist remains, the process goes to the high-temperature baking process at Step S105. When it is determined that resist remains on the wafer, the process goes to Step S104, where the resist removal process is performed again.

(Second Modification)

A wafer cleaning method for removing dust according to a second modification of the embodiment of the present invention will be described with reference to the flowchart of FIG. 9.

(A) In Step S201, the wafer 10 is transported onto the stage 20 and fixed thereto. By using the measurement unit 50, the front-side length Lf of the edge portion 16 in the front face 12 of the wafer 10 is measured. The measurement result is sent to the determination unit 60 as a signal.

(B) In Step S202, using the front-side length Lf of the edge portion 16 as a determination criterion, the determination unit 60 determines which one of the groups in the first class the wafer 10 belongs. For each group in the first class, information is previously stored relating optimum amounts of cleaning liquid to be supplied and optimum rotational speeds at which the wafer 10 is rotated, with respect to the front-side length Lf of the edge portion 16. Accordingly, depending a determination criterion which the classification by the shapes of the edge portion 16, the amounts of cleaning chemical solution to be supplied and a rinse liquid, as cleaning liquids, and the respective rotational speeds at which the wafer 10 is rotated when the cleaning liquids are each supplied, are determined.

(C) In Step S203, the wafer 10 is rotated at a speed corresponding to one of the rotational speeds determined by the determination unit 60. Then, the cleaning chemical solution, such as a fluorine-type chemical solution, is sprayed toward the back face 14 of the spinning wafer 10. The amount of cleaning solution to be supplied corresponds to one of the amounts determined by the determination unit 60 and is supplied to the back face 14. The cleaning chemical solution supplied to the back face 14 is spread to the edge portion 16 of the wafer 10 by centrifugal force. By the cleaning chemical solution being spread to the edge portion 16, dust adhering to the edge portion 16 and back face 14 of the wafer 10 is removed.

(D) In Step S204, the wafer 10 is rotated at a speed corresponding to one of the rotational speeds determined by the determination unit 60. Then, the rinse liquid, such as ultra-pure water, is sprayed toward the back face 14 of the spinning wafer 10. The amount of rinse liquid to be supplied corresponds to one of the amounts determined by the determination unit 60 and is supplied to the back face 14. The rinse liquid supplied to the back face 14 is spread to the edge portion 16 of the wafer 10 by centrifugal force. By the rinse liquid being spread to the edge portion 16, the cleaning chemical solution adhering to the edge portion 16 and back face 14 of the wafer 10 is removed.

According to the cleaning method of the second modification of the embodiment of the present invention, substantially no dust remains on the edge portion 16 because it is possible to control the optimum rotational speeds and the optimum amounts of a cleaning chemical solution and a rinse liquid to be supplied, depending on the shape of the edge portion 16. Moreover, it is possible to perform wafer cleaning without too much cleaning chemical solution and rinse liquid being supplied so as to prevent the excess cleaning solution to contact the device region on the front face of the wafer. As a result, a device, resist film and the like formed in the device region are not removed, and accordingly no reduction of the device region occurs.

(Third Modification)

A cleaning device according to a third modification of the embodiment of the present invention is different from the cleaning device shown in FIG. 1 in that the front-side supply unit 30 is connected to the determination unit 60. The other parts are substantially the same as the cleaning device shown in FIG. 1, and therefore overlapping description will be omitted.

The front-side supply unit 30 blows gas, such as nitrogen ($N_2$), to the front face 12 of the wafer 10. The gas blown to the front face 12 of the wafer 10 prevents the cleaning liquid that comes over to the front side from contacting the device region.

A determination criterion of at least one of the measured front-side length Lf and wettability H of the edge portion 16, which are obtained from the signal sent from the measurement unit 50, is used. The determination unit 64 in the determination unit 60 determines which one of the groups, in the first or second class, the wafer 10 belongs, and then determines the amount of cleaning liquid to be supplied, the rotational speed at which the wafer 10 is rotated, and the amount of gas to be blown from the front-side supply unit 30. The amount of blown gas corresponds to the amount that can maintain a state where the device region is covered by the gas. The determination unit 60 sends information about the amount of blown gas to the front-side supply unit 30.

According to the cleaning device of the third modification of the embodiment, the amount of blown gas supplied from the front-side supply unit 30 is controlled so that the gas maintains coverage of the device region, and therefore it is possible to prevent cleaning liquid from entering the device region.

(Fourth Modification)

Figure 9:
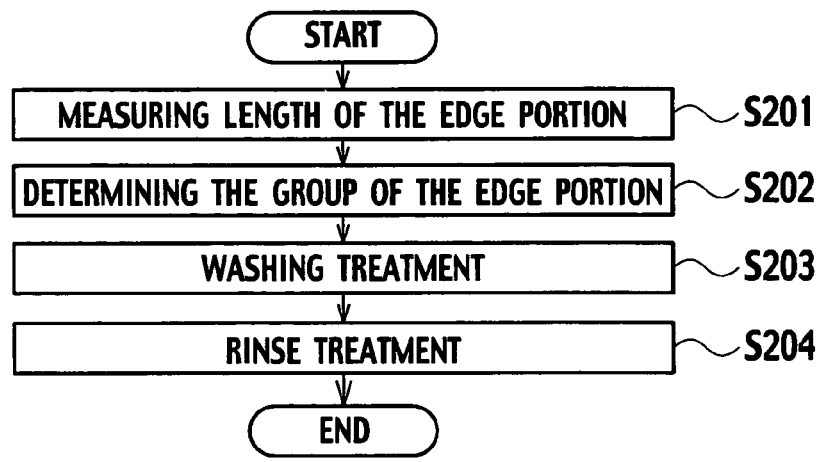
FIG. 9 is a flow chart showing a method for cleaning a wafer according to a second modification of the embodiment of the present invention.
Figure 10:
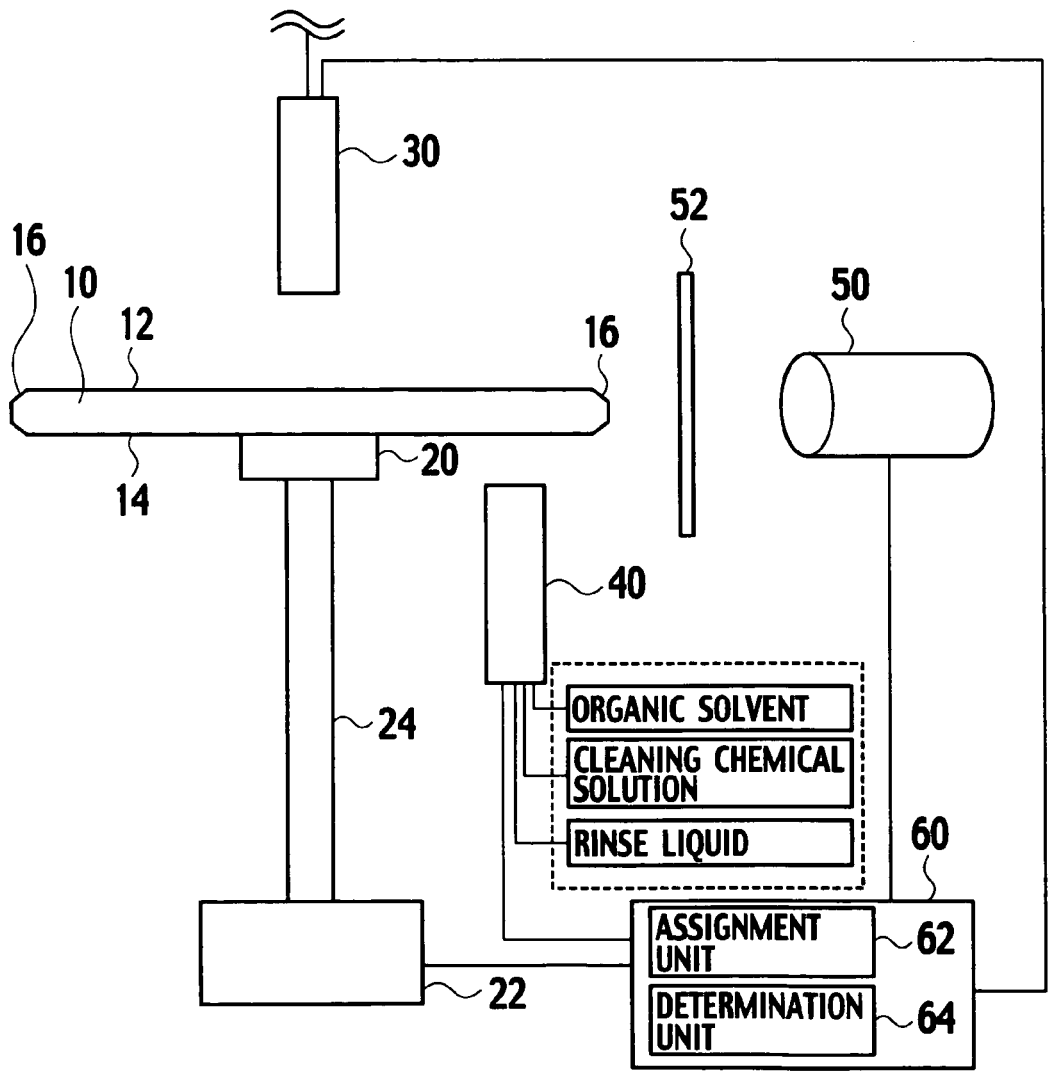
FIG. 10 is a view showing a frame format of a cleaning device according to a third modification of the embodiment of the present invention.
Figure 11:
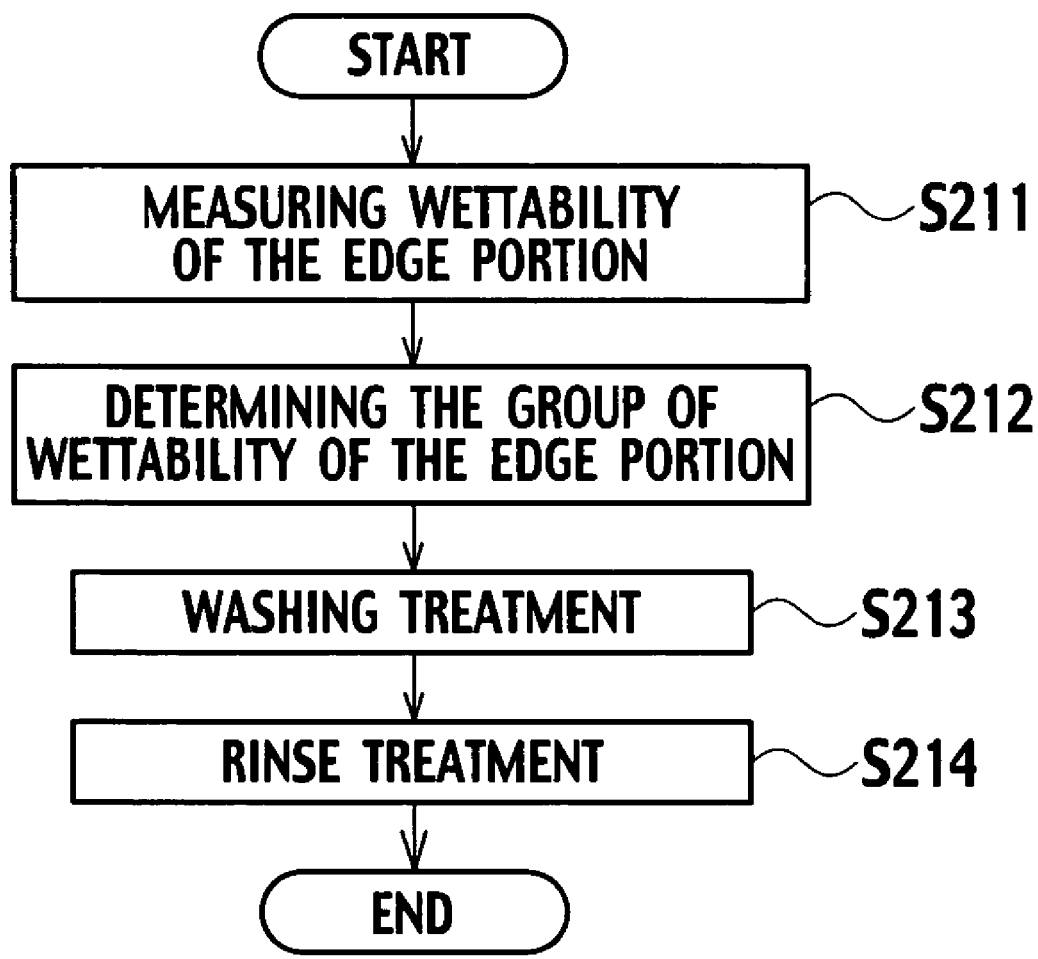
FIG. 11 is a flow chart showing a method for cleaning a wafer according to a fourth modification of the embodiment of the present invention.

A cleaning method for removing dust according to a fourth modification of the embodiment is different from the cleaning method for removing dust shown in the flowchart of FIG. 9 in that, as shown in FIG. 11, the wettability of the edge portion 16 of the wafer 10 is measured. The other parts are substantially the same as the cleaning method for removing dust shown in FIG. 9, and therefore overlapping description will be omitted.

Referring to FIG. 11, first in Step S211, the wafer 10 is transported onto the stage 20 by a wafer transportation robot (not shown). The wafer 10 is fixed to the stage 20 with a vacuum chuck or the like. Then, pure water is sprayed on the wafer 10 from the cleaning liquid supply unit 40 and allowed to adhere to the back face 14 and edge portion 16 of the wafer 10 as shown in FIG. 3. By using the measurement unit 50, the front-side length Lf of the edge portion 16 in the front face 12 of the wafer 10 and the height of a bead of pure water adhering to the edge portion 16 are measured. The measurement results are sent to the determination unit 60 as a signal.

Next, using the front-side length Lf of the edge portion 16 as a determination criterion, the determination unit 60 determines which one of the groups in the first class the wafer 10 belongs. Further, using the wettability H of the edge portion 16 as a determination criterion, the determination unit 60 determines which one of the groups in the second class the wafer 10 belongs. For each group in each of the first and second classes, information is previously set relating to optimum amounts of cleaning liquid to be supplied and optimum rotational speeds at which the wafer 10 is rotated, with respect to the front-side length Lf or wettability H of the edge portion 16. Accordingly, depending on which group the wafer 10 is classified, the amounts of supplied cleaning chemical solution and a rinse liquid, and the respective rotational speeds at which the wafer 10 is rotated when the cleaning liquids are each supplied, are determined.

According to the cleaning method for removing dust of the fourth modification of the embodiment, substantially no dust remains on the edge portion 16 because it is possible to control the optimum rotational speeds and the optimum amounts of supplied cleaning chemical solution and a rinse liquid, depending on the shape and wettability of the edge portion 16. Moreover, it is possible to perform wafer cleaning without too much cleaning chemical solution and rinse liquid being supplied so as to prevent the excess liquids from contacting the device region on the front face of the wafer. As a result, none of a device, resist film and the like formed in the device region are removed, and accordingly no reduction of the device region occurs.

OTHER EMBODIMENTS

As discussed hereinabove, the present invention has been described with preferred embodiments. However, it should be understood that the description and drawings constituting part of the present disclosure are not intended to limit the present invention. Various substitutions and modifications, as well as various technologies utilizing the present invention, should be apparent to those skilled in the art from the present disclosure.

Although the cleaning device shown in FIG. 1 is illustrated as having one measurement unit 50, the number of measurement units is not limited to one, and a plurality of measurement units 50 may be used for measurement.

In the above description, a semiconductor device is taken as an example. However, the present invention is not necessarily limited to the semiconductor device fabrication but is applicable to the manufacturing of various electronic devices other than semiconductor devices, such as liquid crystal displays, heads for magnetic storage media, and superconducting devices.

As to the wafer 10 on which the cleaning process is performed, although the wafer 10 is a semiconductor wafer in the case of the semiconductor device fabrication, treatment of the wafer 10 can be applied to various materials. For example, in the case of a head for a magnetic storage medium, the wafer 10 may be a substrate containing magnetic material. In the case of a superconducting device, such as a Josephson device, the wafer 10 is a wafer of superconducting material.

Moreover, in the above-described embodiments, a vacuum chuck method is mentioned as a method for holding the wafer 10 on the cleaning device. However, the holding method is not limited to the vacuum chuck method, and a wafer edge grip method can also be employed.

As described above, it should be understood that other various embodiments and the like not described here will be included within the scope of the present invention. Accordingly, the present invention is intended to be limited only by the terms of the appended claims in the light of the present disclosure.

What is claimed is:

1. A method for cleaning a wafer comprising:
   measuring a cross-sectional shape of an edge portion of a disk-shaped wafer cut along a radial direction;
   assigning the measured shape to one of a plurality of groups classified by the shapes;
   determining an amount of cleaning liquid to be supplied and rotational speed at which the wafer is rotated depending a determination criterion which the classification by the shapes;
   rotating the wafer at the rotational speed determined by a controller and spraying the cleaning liquid toward a back face of the rotating wafer; and
   cleaning the edge portion and the back face of the wafer by spreading the cleaning liquid to the edge portion of the wafer by centrifugal force.

2. The method of claim 1, further comprising, measuring a wettability of the edge portion of the wafer.

3. The method of claim 2, wherein the wettability is included in the determination criterion.

4. The method of claim 1, wherein measuring the cross-sectional shape comprises:
   fixing the wafer to a stage with a vacuum chuck; and
   measuring the cross-sectional shape of the edge portion of the wafer fixed to the stage.

5. The method of claim 1, wherein measuring the cross-sectional shape comprising:

measuring the edge portion at a plurality of points; and averaging measured values at the plurality of points.

6. The method of claim 1, wherein a front-side length of the edge portion is measured along the radial direction in the cross-sectional shape.

7. The method of claim 1, wherein a back-side length of the edge portion is measured along the radial direction in the cross-sectional shape.

8. The method of claim 1, wherein angles of the edge portion in the cross-sectional shape are measured.

9. The method of claim 1, further comprising, after cleaning the edge portion:

monitoring the edge portion of the wafer; and determining whether the wafer is to be washed again, based on the monitoring of the edge portion.

10. The method of claim 1, further comprising, before spread the cleaning liquid, blowing gas to a front face of the wafer.

* * * * *